(12) United States Patent
Shu et al.

(10) Patent No.: US 9,704,746 B1
(45) Date of Patent: Jul. 11, 2017

(54) ADVANCED SELF-ALIGNED PATTERNING PROCESS WITH SIT SPACER AS A FINAL DIELECTRIC ETCH HARDMASK

(71) Applicant: GLOBALFOUNDRIES Inc., Grand Cayman (KY)

(72) Inventors: Jiehui Shu, Clifton Park, NY (US); Jinping Liu, Ballston Lake, NY (US); Archana Subramaniyan, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/235,892

(22) Filed: Aug. 12, 2016

(51) Int. Cl.
| | | |
|---|---|---|
| *H01L 21/768* | (2006.01) | |
| *H01L 21/311* | (2006.01) | |
| *H01L 21/027* | (2006.01) | |
| *H01L 21/02* | (2006.01) | |

(52) U.S. Cl.
CPC .... *H01L 21/76897* (2013.01); *H01L 21/0262* (2013.01); *H01L 21/0276* (2013.01); *H01L 21/02565* (2013.01); *H01L 21/31116* (2013.01); *H01L 21/76802* (2013.01); *H01L 21/76879* (2013.01)

(58) Field of Classification Search
CPC ......... H01L 21/76897; H01L 21/76802; H01L 21/0262; H01L 21/0276; H01L 21/02565; H01L 21/31116
USPC ...................................................... 438/666
See application file for complete search history.

(56) References Cited

U.S. PATENT DOCUMENTS 7,052,621 B2 * 5/2006 Kumar ................ H01L 21/0332
216/51

* cited by examiner

*Primary Examiner* — Selim Ahmed
(74) *Attorney, Agent, or Firm* — Ditthavong & Steiner, P.C.

(57) ABSTRACT

A method of forming a metallization layer by ASAP is provided. Embodiments include forming an ULK layer; forming a SAC SiN layer over the ULK layer; forming mandrels directly on the SAC SiN layer; cutting the mandrels; selectively etching the SAC SiN layer across the cut mandrels, forming first trenches; filling the first trenches with a metal oxide; forming a conformal metal oxide layer over the cut mandrels, the metal oxide, and the SAC SiN layer; removing horizontal portions of the conformal metal oxide layer over the cut mandrels and the SAC SiN layer; removing the cut mandrels; removing exposed portions of the SAC SiN layer and etching the underlying ULK layer, forming second trenches; and stripping a remainder of the metal oxide, conformal metal oxide layer, and SAC SiN layer.

20 Claims, 10 Drawing Sheets

BACKGROUND

US 9,704,746 B1

ADVANCED SELF-ALIGNED PATTERNING PROCESS WITH SIT SPACER AS A FINAL DIELECTRIC ETCH HARDMASK

TECHNICAL FIELD

The present disclosure relates to the manufacture of semiconductor devices, such as integrated circuits (ICs). The present disclosure is particularly applicable to formation of a metallization layer in the fabrication of a semiconductor device, particularly for the 7 nanometer (nm) technology node and beyond.

BACKGROUND

As semiconductor devices continue to get smaller and technology nodes shrink into the lower nanometer range, device scaling needs to continue to provide both lower cost and improved performance. An advanced self-aligned patterning (ASAP) is one of the methods for extending the capabilities of photolithographic techniques. FIG. 1 illustrates a conventional ASAP film stack. In FIG. 1, an ultra low-K (ULK) layer 103 is formed over an Nblock (©Applied Materials) layer 101, and a self-aligned contact (SAC) silicon nitride (SiN) layer 105 is formed over the ULK layer 103. Next, a TiN layer 107 and a SiN layer 109 are consecutively formed over the SAC SiN layer 105 as a hardmask (HM) and memorization layer, respectively. Then, an amorphous silicon (aSi) layer 111, a spin-on hardmask (SOH) layer 113, a silicon oxynitride (SiON) layer 115, a bottom antireflective coating (BARC) layer 117, and a photoresist 119 are consecutively formed over the SiN layer 109. Next, the photoresist 119 is patterned, and mandrels are formed by reactive ion etching (RIE) the aSi layer 111 through the patterned photoresist. Then, another SOH layer, SiON layer, BARC layer, and photoresist are formed over the mandrels, the photoresist is patterned, and the mandrels are cut by RIE through the patterned photoresist. The layers are repeated once more, and the SiN layer is cut by RIE through the patterned photoresist. Then, spacers are formed around the cut mandrels, and the mandrels are removed. Next, the TiN HM is removed, the underlying ULK layer 103 is etched by RIE through the spacers, and metal is deposited in the etched ULK layer. However, extra materials and deposition process steps are needed to form the SiN and TiN layers.

A need therefore exists for methodology enabling an ASAP process with fewer layers and reduced process steps.

SUMMARY

An aspect of the present disclosure is a method of forming a metallization layer including forming mandrels directly on the SAC SiN layer.

Another aspect of the present disclosure is a method of forming a metallization layer including forming a conformal metal oxide as sidewall image transfer (SIT) spacers for final dielectric etch hardmask.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a ULK layer; forming a SAC SiN layer over the ULK layer; forming mandrels directly on the SAC SiN layer; cutting the mandrels; selectively etching the SAC SiN layer across the cut mandrels, forming first trenches; filling the first trenches with a metal oxide; forming a conformal metal oxide layer over the cut mandrels, the metal oxide, and the SAC SiN layer; removing horizontal portions of the conformal metal oxide layer over the cut mandrels and the SAC SiN layer; removing the cut mandrels; removing exposed portions of the SAC SiN layer and etching the underlying ULK layer, forming second trenches; and stripping a remainder of the metal oxide, conformal metal oxide layer, and SAC SiN layer.

Another aspect includes cutting the mandrels by: forming a SOH layer over the mandrels; forming a SiON layer over the SOH layer; forming a BARC layer over the SiON layer; forming and patterning a photoresist over the BARC layer; etching the BARC layer, the SiON layer, the SOH layer and the mandrels through the patterned photoresist by RIE; and removing the photoresist and a remainder the BARC layer, the SiON layer and the SOH layer. Further aspects include selectively etching the SAC SiN layer by a dry etch stopping on the ULK layer or a timed etch stopping part way through the SAC SiN layer. Other aspects include forming the conformal metal oxide layer by atomic layer deposition (ALD). Additional aspects include conformal metal oxide layer including titanium oxide ($TiO_x$). Another aspect includes removing horizontal portions of the conformal metal oxide layer by dry etch. Further aspects include removing exposed portions of the SAC SiN layer and etching the underlying ULK layer by RIE. Other aspects include forming the mandrels of aSi or amorphous carbon (aC). Additional aspects include filling the second trenches with metal. Another aspect includes forming the SAC SiN layer to a thickness of 5 nm to 20 nm.

A further aspect of the present disclosure is a method including: forming an ULK layer; forming a SAC SiN layer to a thickness of 5 nm to 20 nm over the ULK layer; forming a mandrel layer over the SAC SiN layer; etching the mandrel layer, forming mandrels; forming a SOH layer over the mandrels; forming a SiON layer over the SOH layer; forming a BARC layer over the SiON layer; forming and patterning a photoresist over the BARC layer; cutting the mandrels by etching the BARC layer, the SiON layer, the SOH layer and the mandrels through the patterned photoresist by RIE; removing the photoresist, the BARC layer, the SiON layer and the SOH layer; selectively etching the SAC SiN layer by dry etch stopping on the ULK or by a timed etch stopping part way through the SAC SiN layer, forming first trenches; filling the first trenches with metal oxide; forming a conformal metal oxide layer over the cut mandrels, the metal oxide, and the SAC SiN layer; removing horizontal portions of the conformal metal oxide layer over the cut mandrels and the SAC SiN layer; removing the cut mandrels; removing exposed portions of the SAC SiN layer and etching the underlying ULK layer, forming second trenches; and stripping a remainder of the metal oxide, conformal metal oxide layer, and SAC SiN layer.

Aspects include selectively etching the SAC SiN layer perpendicular to and crossing the cut mandrels. Other aspects include forming the conformal metal oxide layer by ALD. A further aspect includes the conformal metal oxide layer including $TiO_x$. Another aspect includes removing horizontal portions of the conformal metal oxide layer by dry etch. Other aspects include removing exposed portions of the SAC SiN layer and etching the underlying ULK layer by RIE. A further aspect includes forming the mandrels of aSi or aC. Another aspect includes filling the second trenches with metal.

Another aspect of the present disclosure is a method including: forming an ULK layer; forming a SAC SiN layer to a thickness of 5 nm to 20 nm over the ULK layer; forming aSi or aC mandrels over the SAC SiN layer; forming a SOH layer over the mandrels; forming a SiON layer over the SOH layer; forming a BARC layer over the SiON layer; forming and patterning a photoresist over the BARC layer; cutting the mandrels by etching the BARC layer, the SiON layer, the SOH layer and the mandrels through the patterned photoresist by RIE; removing the photoresist, the BARC layer, the SiON layer and the SOH layer; selectively etching the SAC SiN layer perpendicular to and crossing the cut mandrels by dry etch stopping on the ULK or by a timed etch stopping part way through the SAC SiN layer, forming first trenches; filling the first trenches with $TiO_x$; depositing a conformal $TiO_x$ layer by ALD over the cut mandrels, the $TiO_x$, and the SAC SiN layer; removing horizontal portions of the conformal $TiO_x$ layer over the cut mandrels and the SAC SiN layer by dry etch; removing the cut mandrels; removing exposed portions of the SAC SiN layer and etching the underlying ULK layer by RIE, forming second trenches; and stripping a remainder of the $TiO_x$, conformal $TiO_x$ layer, and SAC SiN layer. Another aspect includes filling the second trenches with metal.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 2A through 2I schematically illustrate sequential steps of a ASAP method, in accordance with an exemplary embodiment.

DETAILED DESCRIPTION

Figure 1:
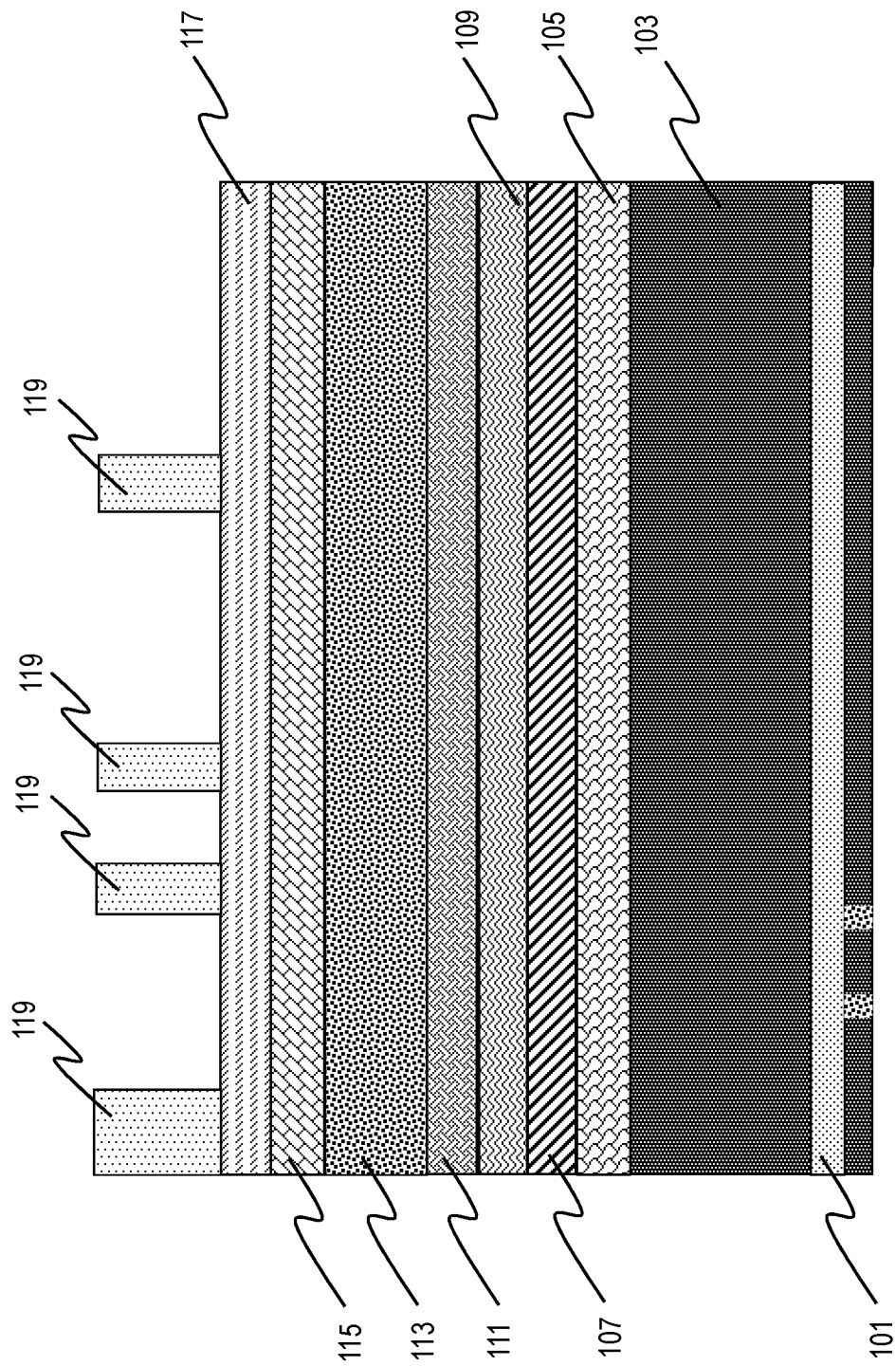
FIG. 1 illustrates a conventional ASAP film stack, in accordance with an exemplary embodiment.

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of extra layers and corresponding process steps of layer formation attendant upon performing a conventional ASAP process. In accordance with embodiments of the present disclosure, mandrels are formed directly on an SAC SiN layer and a conformal metal oxide layer is used as a final dielectrics etch HM, thereby eliminating the need for a TiN HM and a SiN memorization layer.

Methodology in accordance with embodiments of the present disclosure includes forming an ULK layer and a SAC SiN layer over the ULK layer. Then, mandrels are formed directly on the SAC SiN layer. Next, the mandrels are cut. Then, the SAC SiN layer is selectively etched across the cut mandrels. Next, first trenches are formed and are filled with a metal oxide. Subsequently, a conformal metal oxide layer is formed over the cut mandrels, the metal oxide, and the SAC SiN layer. Then, horizontal portions of the conformal metal oxide layer over the cut mandrels and the SAC SiN layer are removed. Next, the cut mandrels are removed. After that, the exposed portions of the SAC SiN layer are removed, and the underlying ULK layer is etched, thereby forming second trenches. Then, a remainder of the metal oxide, conformal metal oxide layer, and SAC SiN layer are stripped.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

FIGS. 2A through 2I schematically illustrate sequential steps of a ASAP method, in accordance with an exemplary embodiment. Adverting to FIG. 2A, an ULK layer 203 is formed, for example to a thickness of 30 nm to 60 nm, over an Nblock layer 201 having a thickness of 10 nm to 20 nm. A SAC SiN layer 205 is formed, e.g. to a thickness of 5 nm to 20 nm over the ULK layer 203. Subsequently, mandrels 207 are formed directly on the SAC SiN layer 205. The mandrels are formed by depositing, for example, aSi or aC by plasma enhanced chemical vapor deposition (PECVD) to a thickness of 40 nm to 80 nm, patterning a lithographic mask over the aSi or aC, and performing RIE. The mandrels 207 are formed of aSi or aC.

Figure 2A:
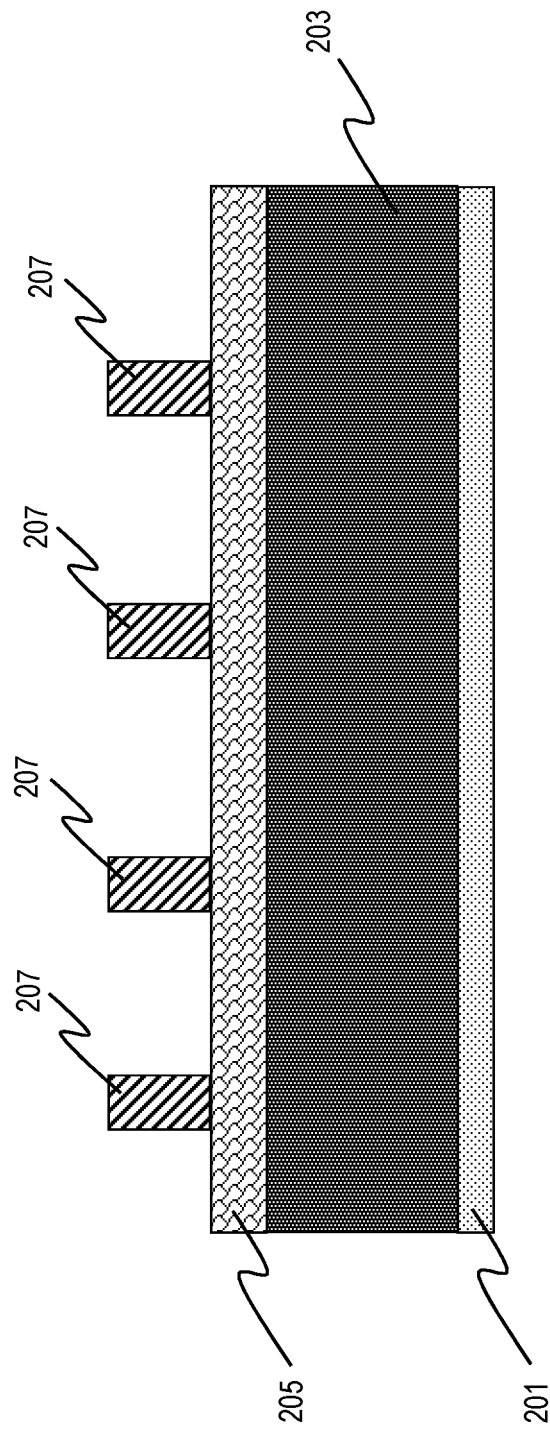
Figure 2B:
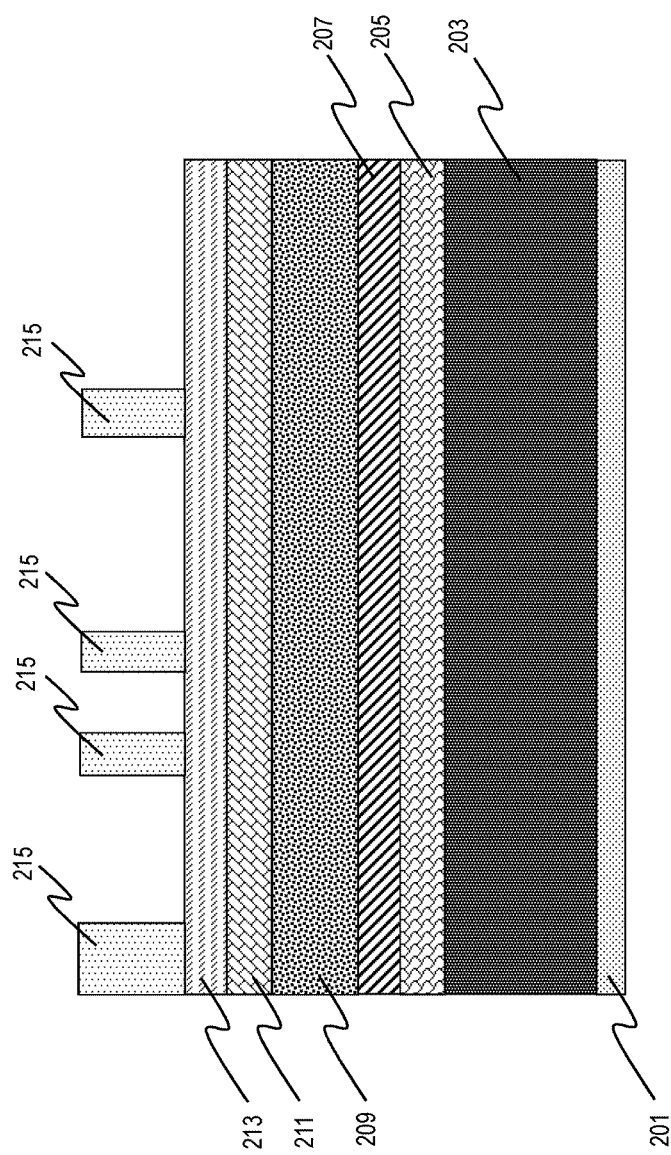

Adverting to FIG. 2B, a SOH layer 209 is formed, e.g. to a thickness of 60 nm to 100 nm, a SiON layer 211 is formed, e.g. to a thickness of 15 nm to 30 nm, and a BARC layer 213 is formed, e.g. to a thickness of 15 nm to 30 nm, sequentially over the mandrels 207. Then, a photoresist 215 is formed, for example to a thickness of 60 nm to 100 nm, over the BARC layer 213 and is patterned, forming a cut mask for the mandrels.

Figure 2C:
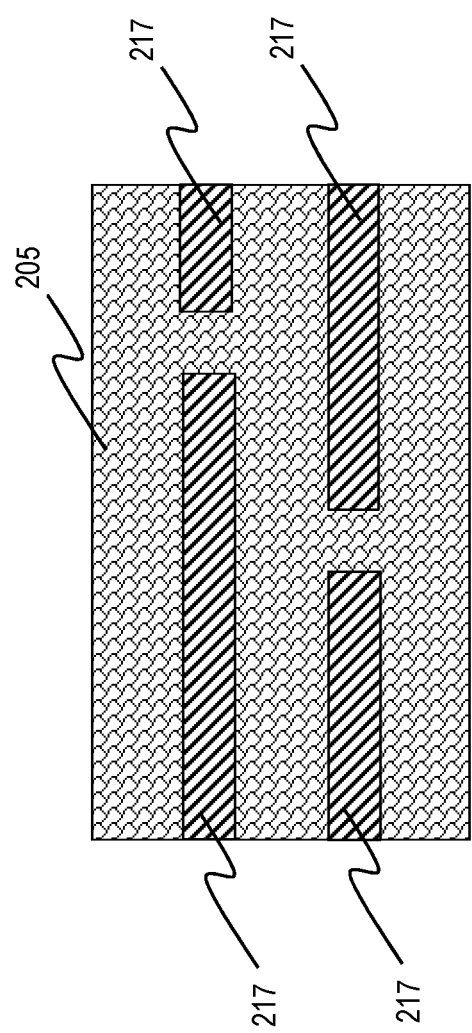

The BARC layer 213, the SiON layer 211, the SOH layer 209 and the mandrels 207 are etched through the patterned photoresist 215 by RIE (not shown for illustrative convenience), stopping on the SAC SiN layer 205. Then, the patterned photoresist 215 is removed. Next, the remainder of the BARC layer 213, the SiON layer 211 and the SOH layer 209 are removed. Accordingly, cut mandrels 217 are formed over the SAC SiN layer 205. FIG. 2C is a top view of the cut mandrels 217 over the SAC SiN layer 205.

Figure 2D:
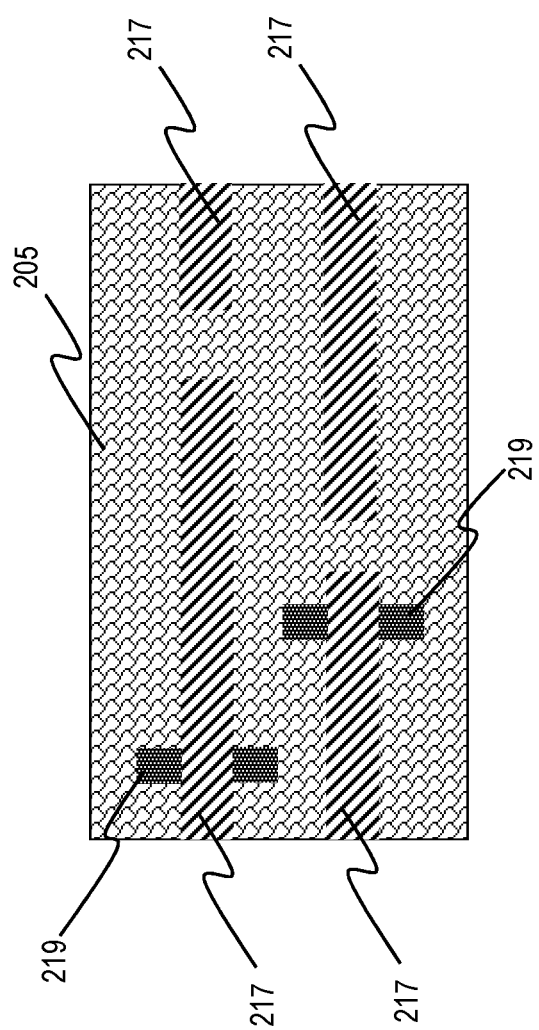

In FIG. 2D, trenches 219 are formed by selectively etching the SAC SiN layer 205 across the cut mandrels 217. The SAC SiN layer 205 is selectively etched by a dry etch, stopping on the ULK layer 203, or by a timed etch, stopping part way through the SAC SiN layer 205. The width of the trenches 219 is design rule dependent, but must be less than double the thickness of the subsequently formed spacers 225 (shown in FIG. 2F).

Figure 2E:
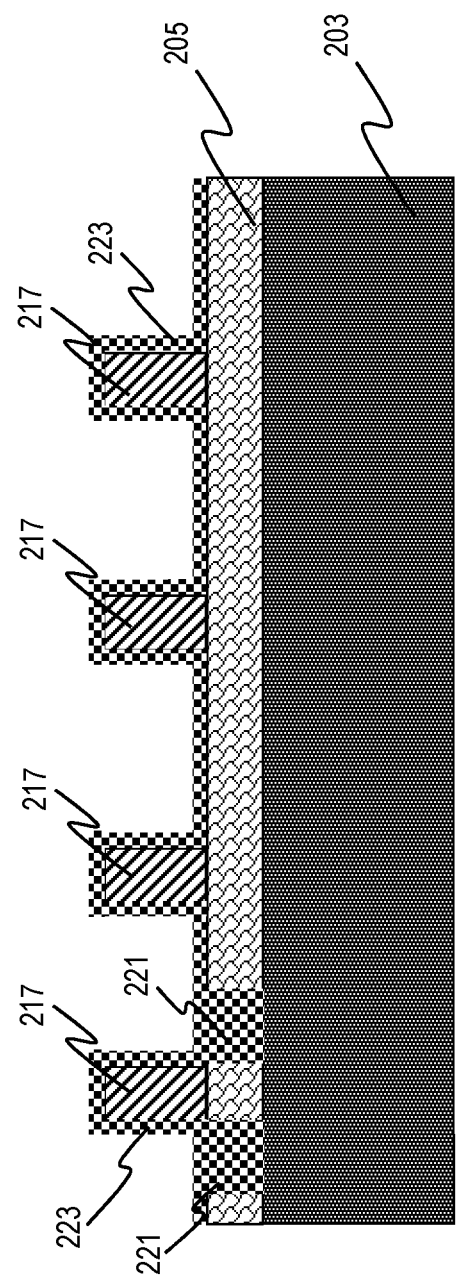

Adverting to FIG. 2E, the trenches 219 are filled with metal oxide 221. Then, a conformal metal oxide layer 223 is formed over the cut mandrels 217, the metal oxide 221, and the SAC SiN layer 205 by atomic layer deposition (ALD). The conformal metal oxide layer 223 may for example be formed of $TiO_x$. The thickness of the conformal metal oxide layer 223 may be approximately 20 nm, but is design rule dependent.

Figure 2F:
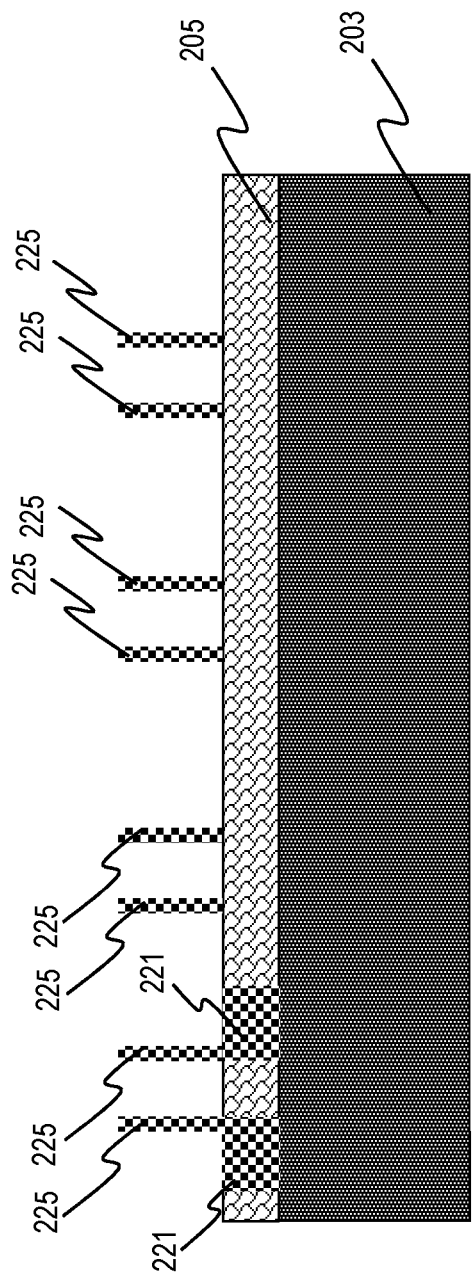

In FIG. 2F, the horizontal portions of the conformal metal oxide layer 223 over the cut mandrels 217 and the SAC SiN layer 205 are removed by dry etch revealing the cut mandrels 217. Then, the cut mandrels 217 are removed by a dry etch. As a result, vertical portions of the conformal metal oxide layer 225, or spacers 225, remain over the SAC SiN layer 205 and the metal oxide 221.

Figure 2G:
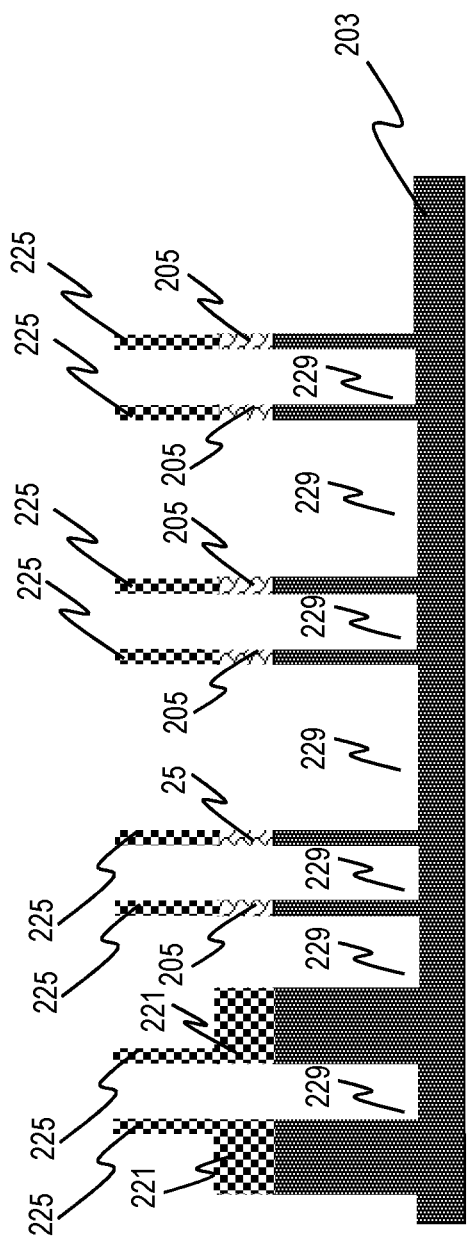

Adverting to FIG. 2G, the exposed portions of the SAC SiN layer 205 are removed by RIE using the metal oxide spacers 225 as a mask. Then, the underlying ULK layer 203 is etched forming trenches 229.

Figure 2H:
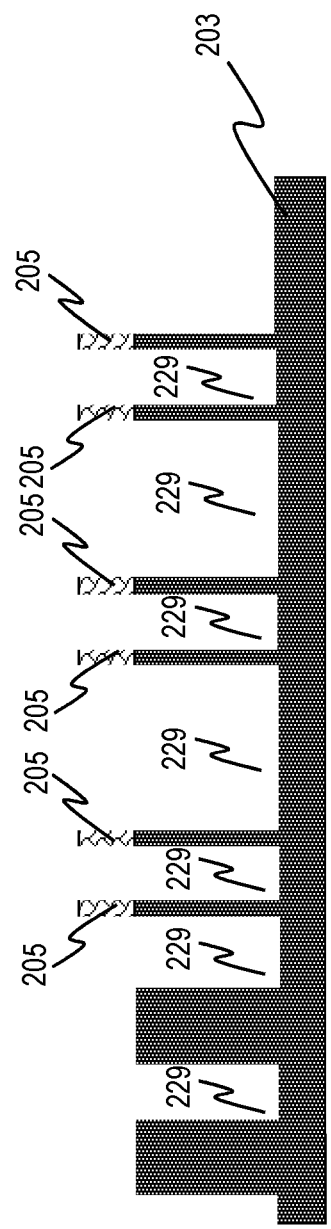
Figure 21:
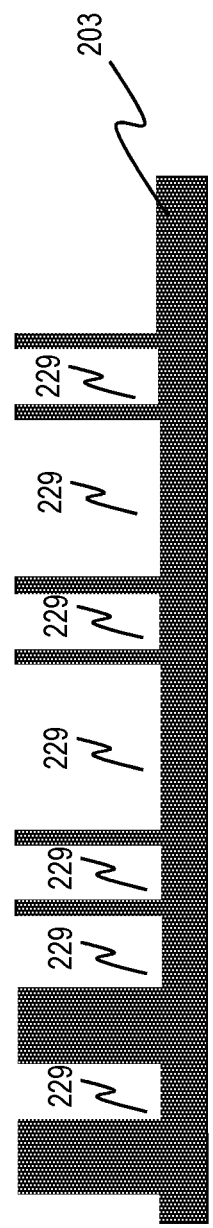

In FIG. 2H, the metal oxide 221 and the remainder of the spacers 225 are stripped. Then, in FIG. 2I, the remainder SAC SiN layer 205 is stripped. Thereafter, the trenches 229 are filled with metal forming a metallization layer.

The embodiments of the present disclosure can achieve several technical effects, such as reducing the number of layers and the process steps of layer formation during an ASAP process. Devices formed in accordance with embodiments of the present disclosure enjoy utility in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of highly integrated semiconductor devices, particularly for the 7 nm technology node and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   forming an ultra low-K (ULK) layer;
   forming a self-aligned contact (SAC) silicon nitride (SiN) layer over the ULK layer;
   forming mandrels directly on the SAC SiN layer;
   cutting the mandrels;
   selectively etching the SAC SiN layer across the cut mandrels, forming first trenches;
   filling the first trenches with a metal oxide;
   forming a conformal metal oxide layer over the cut mandrels, the metal oxide, and the SAC SiN layer;
   removing horizontal portions of the conformal metal oxide layer over the cut mandrels and the SAC SiN layer;
   removing the cut mandrels;
   removing exposed portions of the SAC SiN layer and etching the underlying ULK layer, forming second trenches; and
   stripping a remainder of the metal oxide, conformal metal oxide layer, and SAC SiN layer.

2. The method according to claim 1, comprising cutting the mandrels by:
   forming a spin-on hardmask (SOH) layer over the mandrels;
   forming a silicon oxynitride (SiON) layer over the SOH layer;
   forming a bottom anti-reflective coating (BARC) layer over the SiON layer;
   forming and patterning a photoresist over the BARC layer;
   etching the BARC layer, the SiON layer, the SOH layer and the mandrels through the patterned photoresist by reactive ion etch (RIE); and
   removing the photoresist and a remainder the BARC layer, the SiON layer and the SOH layer.

3. The method according to claim 1, comprising:
   selectively etching the SAC SiN layer by a dry etch stopping on the ULK layer or a timed etch stopping part way through the SAC SiN layer.

4. The method according to claim 1, comprising forming the conformal metal oxide layer by atomic layer deposition (ALD).

5. The method according to claim 1, wherein the conformal metal oxide layer comprises titanium oxide ($TiO_x$).

6. The method according to claim 1, comprising removing horizontal portions of the conformal metal oxide layer by dry etch.

7. The method according to claim 1, comprising removing exposed portions of the SAC SiN layer and etching the underlying ULK layer by RIE.

8. The method according to claim 1, comprising forming the mandrels of amorphous silicon (aSi) or amorphous carbon (aC).

9. The method according to claim 1, further comprising filling the second trenches with metal.

10. The method according to claim 1, comprising forming the SAC SiN layer to a thickness of 5 nm to 20 nm.

11. A method comprising:
    forming an ultra low-K (ULK) layer;
    forming a self-aligned contact (SAC) silicon nitride SiN layer to a thickness of 5 nm to 20 nm over the ULK layer;
    forming a mandrel layer over the SAC SiN layer;
    etching the mandrel layer, forming mandrels;
    forming a spin-on hardmask (SOH) layer over the mandrels;
    forming a silicon oxynitride (SiON) layer over the SOH layer;
    forming a bottom anti-reflective coating (BARC) layer over the SiON layer;
    forming and patterning a photoresist over the BARC layer;
    cutting the mandrels by etching the BARC layer, the SiON layer, the SOH layer and the mandrels through the patterned photoresist by reactive ion etching (RIE);
    removing the photoresist, the BARC layer, the SiON layer and the SOH layer;
    selectively etching the SAC SiN layer by dry etch stopping on the ULK or by a timed etch stopping part way through the SAC SiN layer, forming first trenches;
    filling the first trenches with metal oxide;

forming a conformal metal oxide layer over the cut mandrels, the metal oxide, and the SAC SiN layer;

removing horizontal portions of the conformal metal oxide layer over the cut mandrels and the SAC SiN layer;

removing the cut mandrels;

removing exposed portions of the SAC SiN layer and etching the underlying ULK layer, forming second trenches; and stripping a remainder of the metal oxide, conformal metal oxide layer, and SAC SiN layer.

12. The method according to claim 11, comprising selectively etching the SAC SiN layer perpendicular to and crossing the cut mandrels.

13. The method according to claim 11, comprising forming the conformal metal oxide layer by atomic layer deposition (ALD).

14. The method according to claim 11, wherein the conformal metal oxide layer comprises titanium oxide ($TiO_x$).

15. The method according to claim 11, comprising removing horizontal portions of the conformal metal oxide layer by dry etch.

16. The method according to claim 11, comprising removing exposed portions of the SAC SiN layer and etching the underlying ULK layer by RIE.

17. The method according to claim 11, comprising forming the mandrels of amorphous silicon (aSi) or amorphous carbon (aC).

18. The method according to claim 11, further comprising filling the second trenches with metal.

19. A method comprising:

forming an ultra low-K (ULK) layer;

forming a self-aligned contact (SAC) silicon nitride (SiN) layer to a thickness of 5 nm to 20 nm over the ULK layer;

forming amorphous silicon (aSi) or amorphous carbon (aC) mandrels over the SAC SiN layer;

forming a spin-on hardmask (SOH) layer over the mandrels;

forming a silicon oxynitride (SiON) layer over the SOH layer;

forming a bottom anti-reflective coating (BARC) layer over the SiON layer;

forming and patterning a photoresist over the BARC layer;

cutting the mandrels by etching the BARC layer, the SiON layer, the SOH layer and the mandrels through the patterned photoresist by reactive ion etching (RIE);

removing the photoresist, the BARC layer, the SiON layer and the SOH layer;

selectively etching the SAC SiN layer perpendicular to and crossing the cut mandrels by dry etch stopping on the ULK or by a timed etch stopping part way through the SAC SiN layer, forming first trenches;

filling the first trenches with titanium oxide ($TiO_x$);

depositing a conformal $TiO_x$ layer by atomic layer deposition (ALD) over the cut mandrels, the $TiO_x$, and the SAC SiN layer;

removing horizontal portions of the conformal $TiO_x$ layer over the cut mandrels and the SAC SiN layer by dry etch;

removing the cut mandrels;

removing exposed portions of the SAC SiN layer and etching the underlying ULK layer by RIE, forming second trenches; and stripping a remainder of the $TiO_x$, conformal $TiO_x$ layer, and SAC SiN layer.

20. The method according to claim 19, further comprising filling the second trenches with metal.

* * * * *